United States Patent
Herranen et al.

(10) Patent No.: US 7,495,702 B2
(45) Date of Patent: Feb. 24, 2009

(54) PORTABLE ELECTRONIC DEVICE WITH CAMERA

(75) Inventors: Timo Herranen, Viiala (FI); Esa-Sakari Maatta, Viiala (FI)

(73) Assignee: Nokia Corporation, Espoo (FI)

( * ) Notice: Subject to any disclaimer, the term of this patent is extended or adjusted under 35 U.S.C. 154(b) by 655 days.

(21) Appl. No.: 10/774,821

(22) Filed: Feb. 9, 2004

(65) Prior Publication Data
US 2005/0174468 A1  Aug. 11, 2005

(51) Int. Cl.
*H04N 5/225* (2006.01)
(52) U.S. Cl. .......................................... 348/373; 439/70
(58) Field of Classification Search ................. 348/294, 348/373, 374, 375, 87, 142; 257/726, 729, 257/730, 731, 735, 736, 737, 785, 727, 719, 257/711, 691, 688, 433; 438/64, 144, 145, 438/146, 147, 148, 402; 361/296, 741, 727; 439/76.1, 70, 59, 327, 325; 358/513, 906
See application file for complete search history.

(56) References Cited

U.S. PATENT DOCUMENTS

| | | | | |
|---|---|---|---|---|
| 6,768,516 B2 * | 7/2004 | Yamada et al. | ............... | 348/340 |
| 6,836,669 B2 * | 12/2004 | Miyake et al. | ........... | 455/556.1 |
| 7,029,186 B2 * | 4/2006 | Harazono | ..................... | 385/93 |
| 7,077,663 B2 * | 7/2006 | Nishio et al. | .................. | 439/70 |
| 7,110,033 B2 * | 9/2006 | Miyake | ....................... | 348/340 |
| 2003/0070288 A1 * | 4/2003 | Ting | ........................... | 29/832 |
| 2004/0212718 A1 * | 10/2004 | Hiltunen et al. | ............. | 348/340 |

* cited by examiner

*Primary Examiner*—Nhan T. Tran
*Assistant Examiner*—Nelson D Hernández
(74) *Attorney, Agent, or Firm*—Harrington & Smith, PC (57) ABSTRACT

A portable electronic device including a device printed wiring board; an electrical connector connected to the device printed wiring board; and a camera coupled to the device printed wiring board by the electrical connector at a sliding height connection. The sliding height connection allows the camera to slide relative to the electrical connector along a first axis to allow positioning of the camera relative to the electrical connector at one of a plurality of different heights along the first axis.

38 Claims, 10 Drawing Sheets

PORTABLE ELECTRONIC DEVICE WITH CAMERA

BACKGROUND OF THE INVENTION

1. Field of the Invention

The present invention relates to portable electronic devices and, more particularly, to a portable electronic device having a camera or other image taking device.

2. Brief Description of Prior Developments

Portable electronic devices, such as mobile telephones and PDAs, have been provided in the past with a camera for taking digital photographs. However, a problem exists regarding the manufacture of these portable electronic devices with cameras. The devices require individual different camera connection designs to accommodate different positions of the cameras relative to printed wiring boards inside the portable electronic devices. There has not been provided a standardized construction for connecting a camera with a printed wiring board that can be used in multiple different types of designs of portable electronic devices which have their printed wiring boards at different positions inside the portable electronic devices.

There is a problem of how to provide a common camera module in different device models; and especially in device models where device printed wiring boards are located in different positions in a Z direction (relative to an X-Y orientation of the printed wiring board). Product specific cameras and/or connectors for those devices have been manufactured in the past. Those devices have been designed so that a certain camera can fit into a specific device, but cannot be assembled in other designs. This has most probably caused compromises to product construction. This type of individualized device specific connection of cameras to printed wiring boards in different types or configurations of portable electronic devices increases the costs of multiple product lines and increases assembly complexity as well as research and development costs to design the different connections for the different designs.

There is a desire to provide a connection between a camera and a printed wiring board in a portable electronic device which can accommodate location of a module camera unit at various different Z direction positions relative to a printed wiring board to accommodate different designs and types of portable electronic devices. Thus, there is a desire to provide a connection system having common components, such as a common camera module and a common electrical connector, which has a variable or adjustable height connection of the camera module to the electrical connector. This type of variable or adjustable height connection preferably allows location of the camera relative to the printed wiring board at a variety of locations ranging from the printed wiring board being located proximate a rear end of the camera to the printed wiring board being located proximate a front end of the camera.

SUMMARY OF THE INVENTION

In accordance with one aspect of the present invention, a portable electronic device is provided including a device printed wiring board; an electrical connector connected to the device printed wiring board; and a camera coupled to the device printed wiring board by the electrical connector at a sliding height connection. The sliding height connection allows the camera to slide relative to the electrical connector along a first axis to allow positioning of the camera relative to the electrical connector at one of a plurality of different heights along the first axis.

In accordance with another aspect of the present invention, a portable electronic device camera is provided comprising a housing; electrical conductors along a first lateral side of the housing; and a camera printed wiring board stationarily connected to the housing and coupled to the electrical conductors. The electrical conductors are adapted to be removably connected to contacts of an electrical connector located along the first lateral side of the housing.

In accordance with another aspect of the present invention, a printed wiring board and electrical connector subassembly is provided comprising a mobile telephone printed wiring board; and a camera electrical connector attached to the mobile telephone printed wiring board. The camera electrical connector comprises a camera receiving area adapted to receive a camera therein and make electrical contact with conductors of the camera inside the camera receiving area.

In accordance with another aspect of the present invention, a portable electronic device is provided comprising a device printed wiring board; an electrical connector connected to the device printed wiring board, wherein the electrical connector has a camera receiving slot; and a camera coupled to the printed wiring board by the electrical connector. A housing of the camera is located partially inside the camera receiving area to provide a substantially stationery telescoping connection with a partially coplanar height.

In accordance with one method of the present invention, a method of assembling a portable electronic device is provided comprising providing an electrical connector on a printed wiring board; inserting a camera into a slot through the electrical connector; and making electrical connection between the electrical connector and the camera at a first lateral side of the camera inside the slot of the electrical connector.

BRIEF DESCRIPTION OF THE DRAWINGS

The foregoing aspects and other features of the present invention are explained in the following description, taken in connection with the accompanying drawings, wherein.

DETAILED DESCRIPTION OF THE PREFERRED EMBODIMENTS

Figure 1:
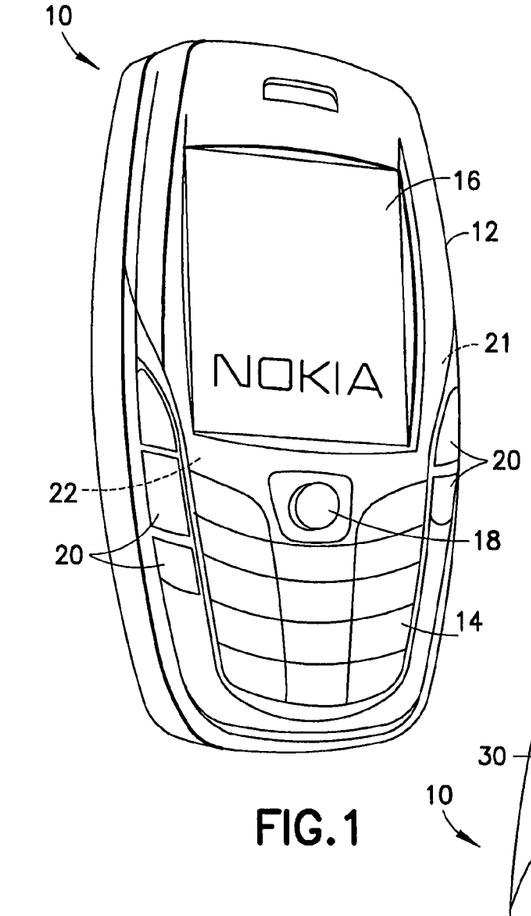
FIG. 1 is a perspective view of a mobile telephone incorporating features of the present invention.

Referring to FIG. 1, there is shown a perspective view of a portable electronic device 10 incorporating features of the present invention. Although the present invention will be described with reference to the exemplary embodiments shown in the drawings, it should be understood that the present invention can be embodied in many alternate forms of embodiments. In addition, any suitable size, shape or type of elements or materials could be used.

The portable electronic device 10, in the embodiment shown, comprises a mobile telephone. In alternate embodiments, the portable electronic device could comprise any suitable type of mobile electronic device including, for example, a PDA, a laptop computer, or an electronic game. Features of the present invention could also be incorporated into other types of electronic devices, such as a stand-alone digital camera adapted to be connected to a desktop computer or personal computer, for example.

Figure 2:
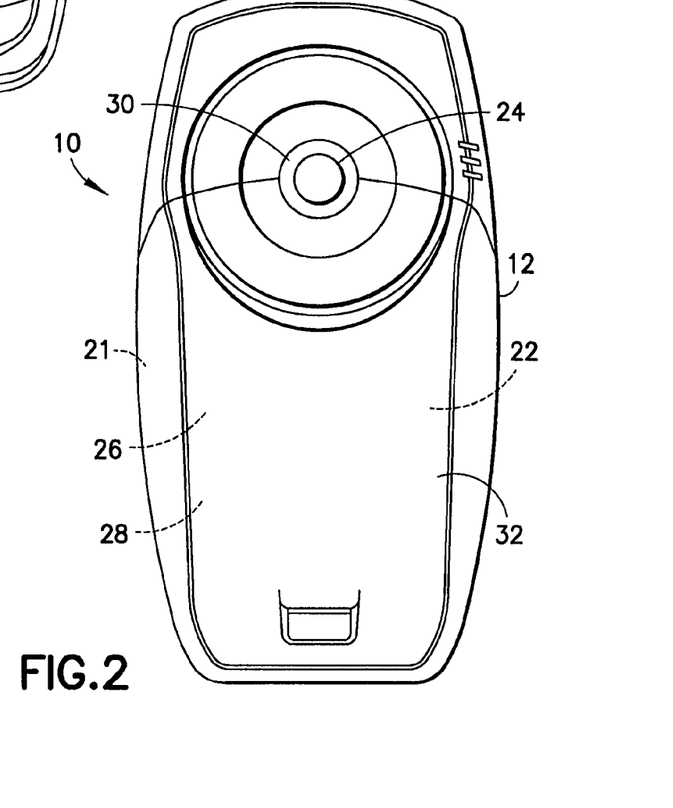
FIG. 2 is a rear side view of the mobile telephone shown in FIG. 1.

Referring also to FIG. 2, the mobile telephone 10 generally comprises a housing 12, a keypad 14, a display 16, a joystick 18, control keys 20, an antenna 21, a digital camera or camera module 24, and electronic circuitry 22 located inside the housing and operably coupled to these components. In alternate embodiments the portable electronic device 10 could comprise additional or alternative components. The electronic circuitry includes a printed wiring board 28 (see also FIG. 3) and a transceiver 26 mounted on the printed wiring board which is connected to the antenna 22. In this embodiment the telephone 10 has a camera window or lens 30 located at a rear side 32 of the housing 12. However, in alternate embodiments, the telephone could have its camera window located at any suitable side of the telephone.

Figure 7:
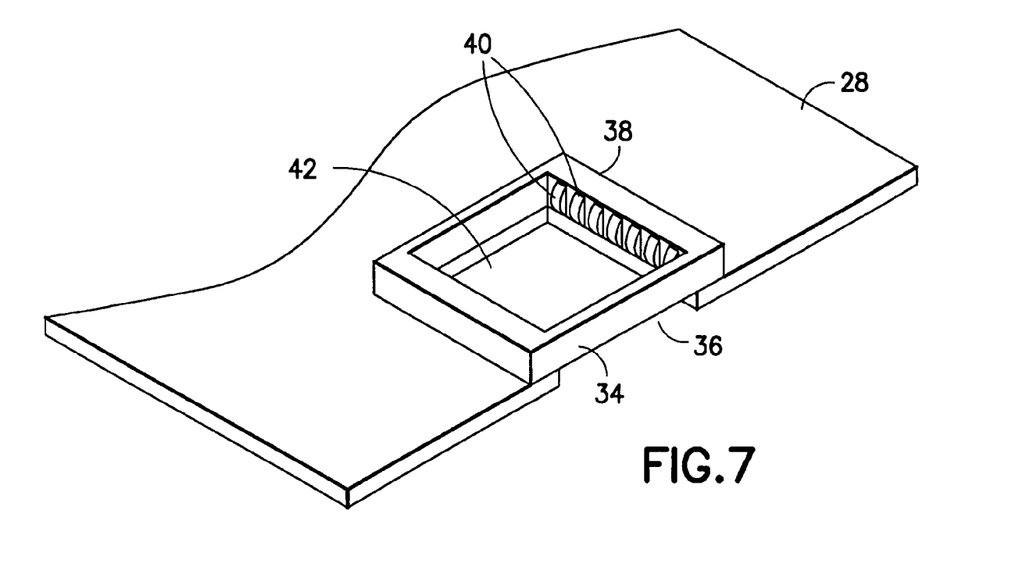
FIG. 7 is a perspective view as in FIG. 5 with the camera module removed from the electrical connector.

Referring also to FIGS. 3-6, the printed wiring board 28 extends along the longitudinal length of the housing. The camera 24 is coupled to the printed wiring board 28 by a connection system comprising an electrical connector 34. In this embodiment, the printed wiring board 28 comprises a slot 36. As seen best in FIGS. 5 and 6, the slot 36 is shown at one end of the printed wiring board. However, in alternate embodiments, the slot could be located spaced from an end of the printed wiring board. Referring also to FIG. 7, the electrical connector 34 generally comprises a housing 38 and electrical contacts 40. In this embodiment, the housing 38 has a general ring shape with a camera module receiving area 42 located in the center of the general ring shape. In an alternate embodiment, the housing could comprise any suitable type of shape so long as the housing comprises a camera module receiving area. The camera module receiving area 42 of the housing 38 is aligned with the slot 36 of the printed wiring board 28 when the electrical connector is attached to the printed wiring board. The camera module receiving area 42 comprises a slot which extends entirely through the housing 38 such that an entirely open passage is provided through the printed wiring board and the electrical connector at the camera module receiving area. In an alternate embodiment, one end of the camera module receiving area could be closed and the slot 36 in the printed wiring board might not be provided.

The electrical contacts 40 preferably comprise spring contacts which are connected to contact pads on the printed wiring board 28, such as by soldered surface mounting or by solder tail through hole mounting. In one type of alternate embodiment, the housing of the electrical connector could be integrally molded with a portion of the housing 12. The electrical contacts 40 have deflectable contact portions which extend into the camera module receiving area 42 from opposite sides of the receiving area. In an alternate embodiment, the deflectable contact portions could extend into the camera module receiving area from more or less than two of the interior facing sides of the housing. However, with the electrical contacts 40 located on opposite sides of the housing 38, forces exerted against the electrical contacts in opposite directions by an inserted camera module 24 can balance each other out for a zero net force of the electrical connector against the printed wiring board.

Figure 8:
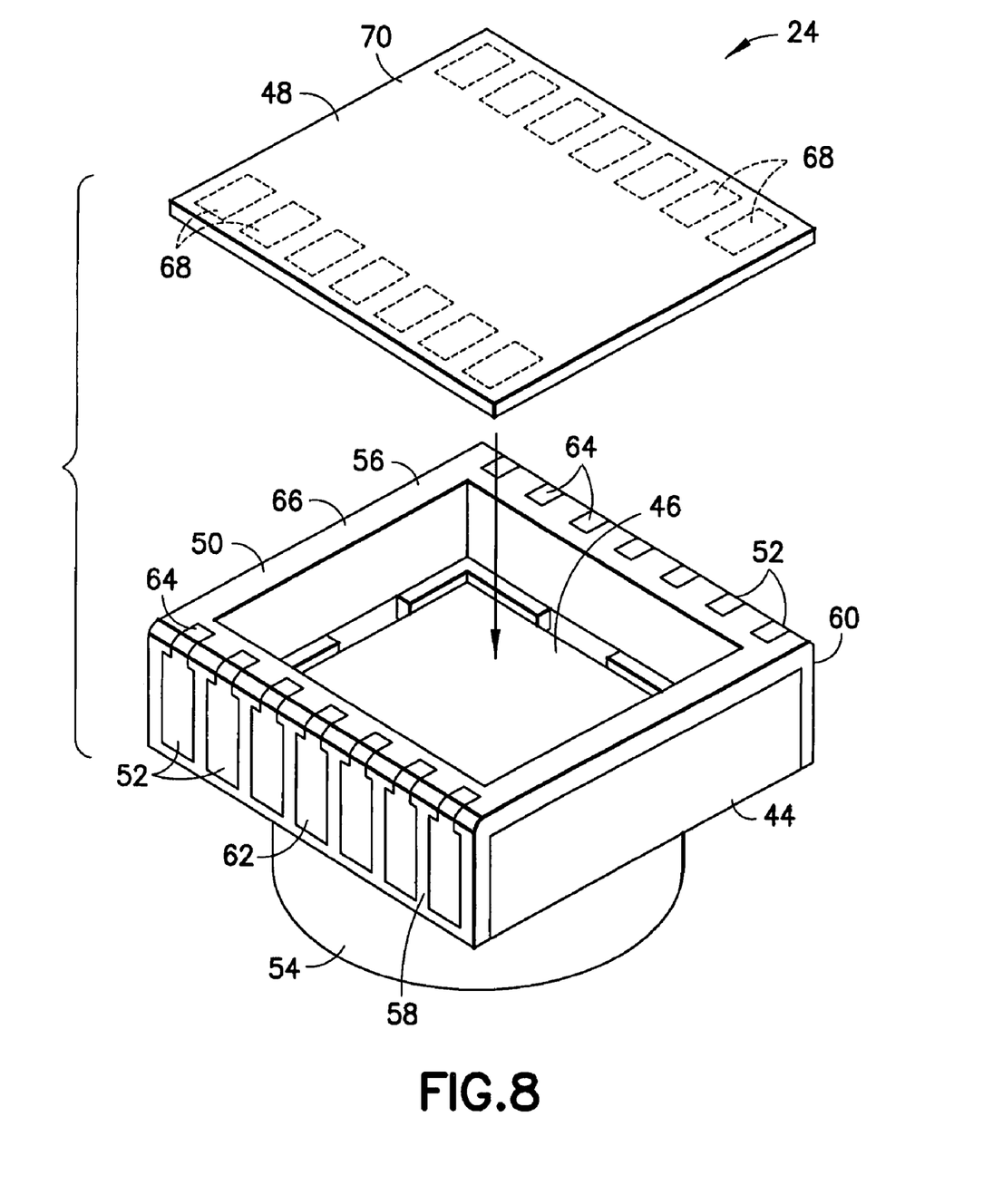
FIG. 8 is an exploded perspective view of the camera module shown in FIG. 4.

Referring also to FIG. 8, the camera module 24 generally comprises a camera module housing 44, and digital camera optics and electronics 46 which include a camera printed wiring board 48. The camera or camera module 24 could comprise any suitable conventional optics and electronics. The camera could comprise a still image digital camera or a video camera, or any other suitable type of electronic image taking device. In this embodiment, the camera module housing 44 preferably comprises an electrically insulating member 50 and electrical conductors 52 located on the exterior of the insulating member. In a preferred embodiment, the electrical conductors 52 comprise metallized conductors formed on the insulating member 50. However, in alternate embodiments, the electrical conductors could comprise separate members which are attached to the insulating member.

The camera module housing 44 comprises a first section 54 and a second section 56. The second section 56, in the embodiment shown, has an exterior profile almost identical to the shape of the camera module receiving area 42. The second section 56 is adapted to be located inside the camera module receiving area 42. A first lateral side 58 of the second section 56 and an opposite second lateral side 60 of the second section 56 has portions 62 of the electrical conductors 52 therealong. Portions 64 of the electrical conductors 52 extend from the first and second lateral sides 58, 60 to and along an adjacent back side 66.

The camera printed wiring board 48 comprises contact pads 68. The camera printed wiring board 48 is attached to the back side 66 of the second section 54 such that the contact pads 68 make electrical connection with the portions 64 of the electrical conductors. For example, the contact pads 68 can be soldered to the portions 64 to attach the camera printed wiring board 48 to the housing 44. Electrical connection between the camera module housing and the camera printed wiring board can be achieved by solder or by special glue when the camera printed wiring board is installed. The back side 70 of the printed wiring board 48 could also comprise electrical connection areas if desired.

Referring back to FIGS. 3-6, the electrical connector 34 is attached to the device printed wiring board 28 at the slot 36 through the printed wiring board 28. Portions of the electrical spring contacts 40 extend into the camera module receiving area 42 (shown best in FIG. 7). The camera module 24 is inserted into the camera module receiving area 42. Specifically, the second section 56 of the camera module housing 44 (shown best in FIG. 8) is located in the camera module receiving area 42. The portions 62 (see FIG. 8) of the electrical conductors 52 are aligned with and contact individual ones of the contacts 40 inside the camera module receiving area 42. More specifically, one row of the contacts 40 contacts the portions 62 on the first lateral side 58 and another row of the contacts 40 contact the portions 62 on the second lateral side 60.

Figure 4:
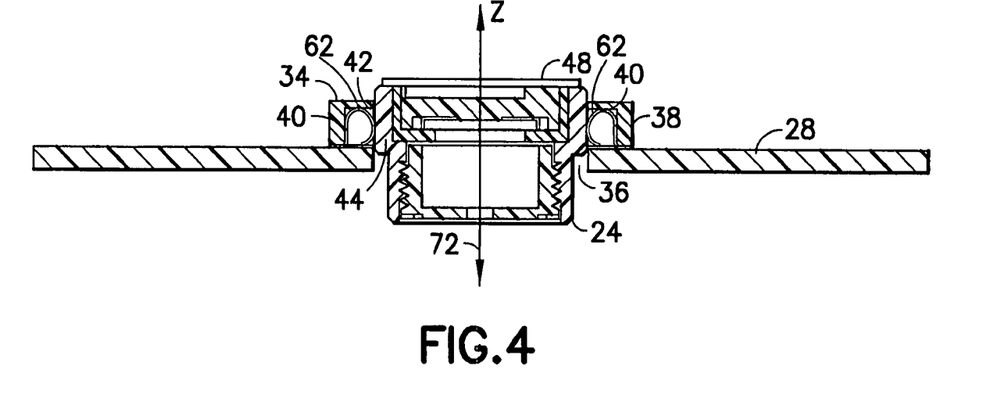
FIG. 4 is a diagrammatic cross sectional view of the camera module, the electrical connector and device printed wiring board shown in FIG. 3.
Figure 5:
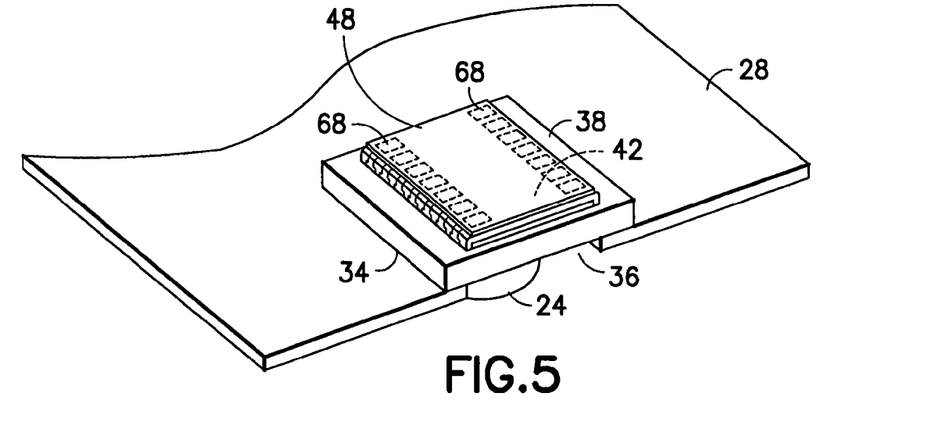
FIG. 5 is a perspective view of the components shown in FIG. 4.
Figure 6:
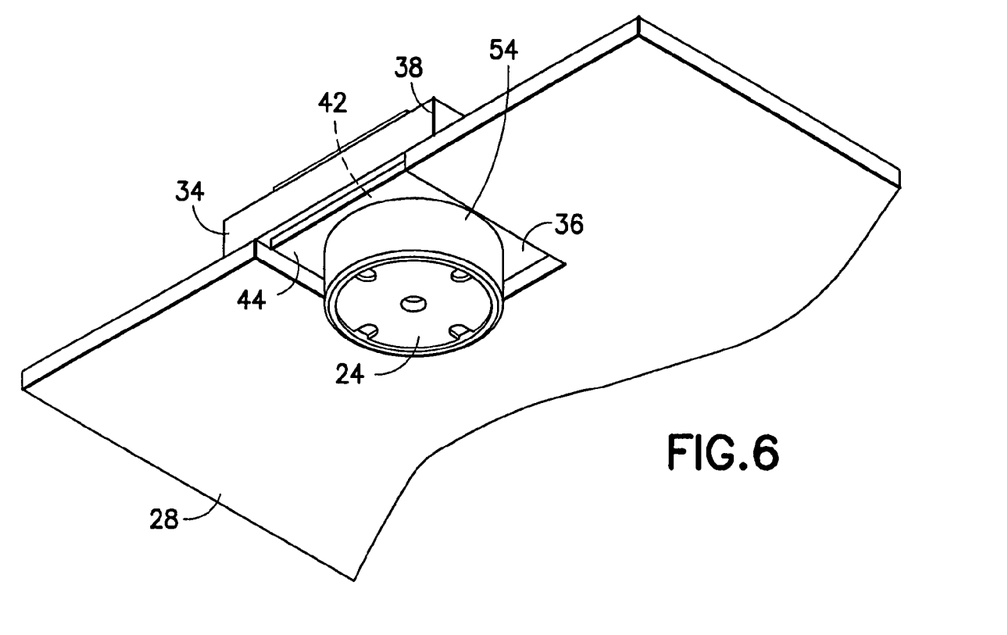
FIG. 6 is a perspective view of the components shown in FIG. 5 taken from an opposite side.

The portions 62 have an elongated length along the sides 58, 60. The camera module 24 is slid into the receiving area 42 along the Z axis 72 as indicated in FIG. 4. The portions 62 are adapted to slide along the contacts 40. The Z position or height of the camera module 24 in the camera module receiving area 42 is variable or adjustable; at least until the camera module is stationarily encased by the telephone housing 12. The contacts 40 are adapted to make electrical connection with the electrical conductors 52 at a variety of different heights along the portions 62. The first section 54 of the camera module housing 44 can extend through the slot 36 of the device printed wiring board 28.

Figure 3:
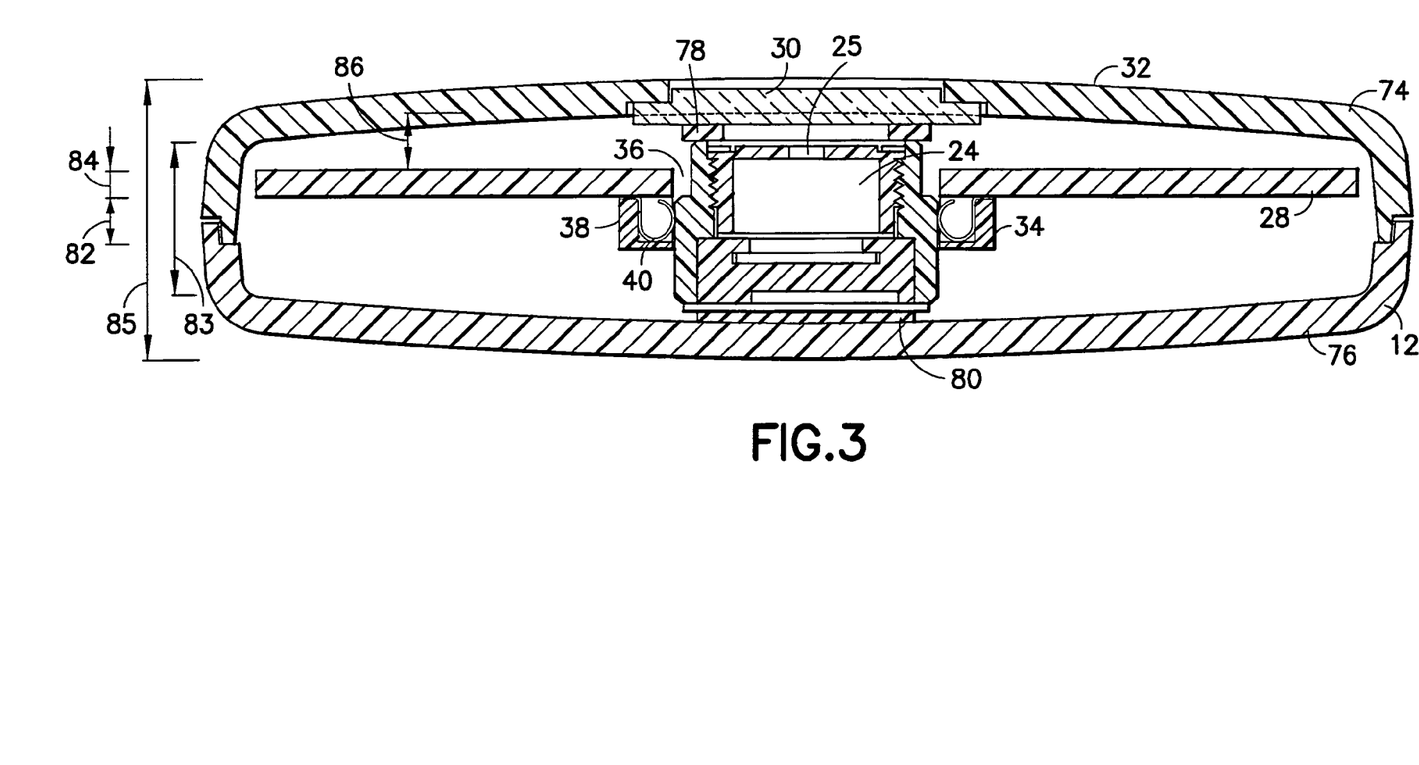
FIG. 3 is a diagrammatic cross sectional view of the telephone shown in FIGS. 1 and 2 at the camera module location.

Referring particularly to FIG. 3, after the camera module 24 is inserted into the electrical connector 34 the rear housing piece 74 of the housing 12 can be connected to the front housing piece 76 of the housing 12 to close the camera module and device printed wiring board 28 inside the housing 12. A camera gasket 78 is provided between the front side of the camera module 24 and the rear side of the window 30. An image inlet aperture 25 of the camera module 24 is located at the inside hole of the gasket. A support pad 80 is provided between the rear side of the camera printed wiring board 48 and the housing 12 to stationarily sandwich and fix the Z direction of the camera module inside the housing 12. In an alternate embodiment the rear end of the camera module could be located against a rear side of another component, such as the display 16 (see FIG. 1) or a support for the keypad 14 (see FIG. 1). The device printed wiring board 28 is also stationarily located inside the housing 12. Thus, the camera module 24 and device printed wiring board 28 are located substantially stationery relative to each other.

The camera module 24 extends through the electrical connector 34 in a general stationery telescoping arrangement. Because the electrical connector 34 is located along a portion 82 of the height of the camera module 24, the overall height 83 of the electrical connector and camera module assembly is smaller than if the electrical connector was located at a rear end of the camera module. The housing of the camera and the housing of the electrical connector have heights which are partially coplanar at height 82; provided by the substantially stationary telescoping connection. In an alternate embodiment, the telescoping connection could be movable rather than substantially stationary. The overall height 83 is merely the height of the camera module 24. This allows the height 85 of the housing 12 to be smaller than conventional portable telephones having cameras. Because the printed wiring board 28 is located along a portion of the height of the camera module 24, the overall height of the assembly is also smaller than if the device printed wiring board was located at a rear end of the camera module.

Figure 9:
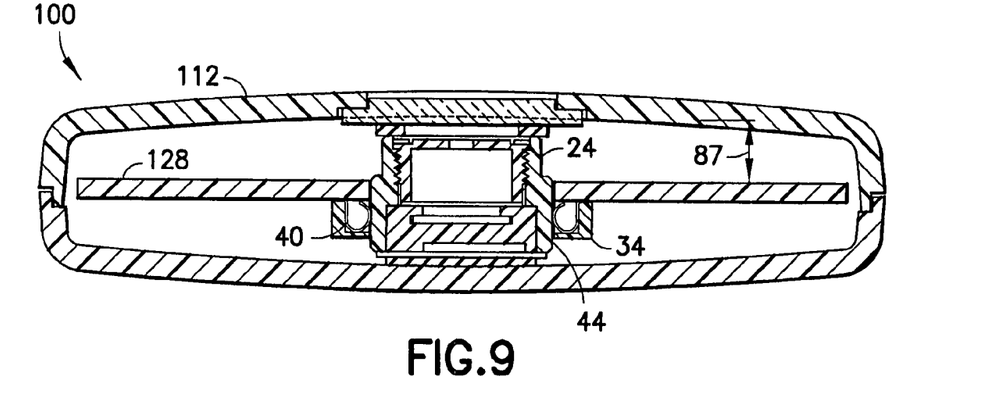
FIG. 9 is a diagrammatic cross sectional view similar to FIG. 3 of an alternate embodiment of a portable electronic device incorporating features of the present invention.
Figure 10:
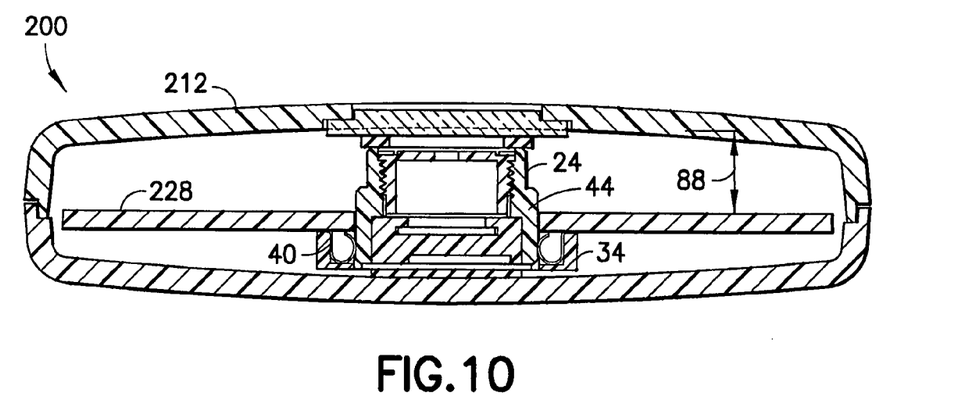
FIG. 10 is a diagrammatic cross sectional view similar to FIG. 3 of another alternate embodiment of a portable electronic device incorporating features of the present invention.
Figure 11:
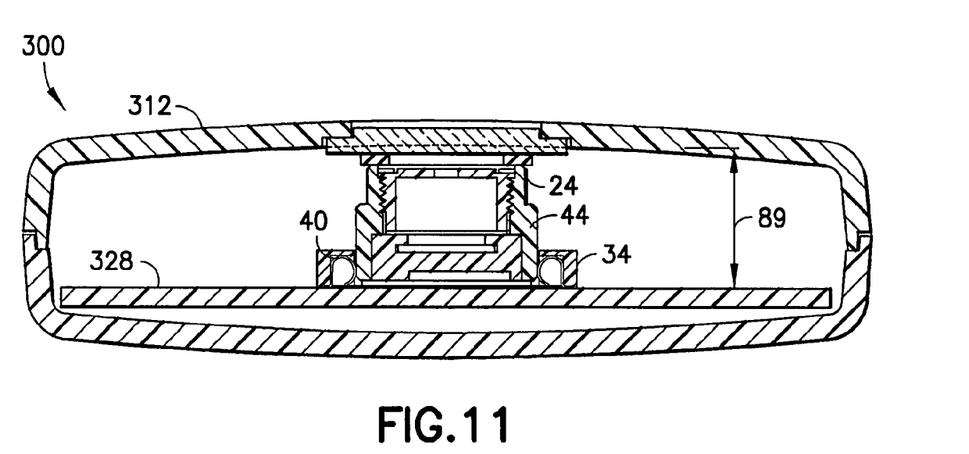
FIG. 11 is a diagrammatic cross sectional view similar to FIG. 3 of another alternate embodiment of a portable electronic device incorporating features of the present invention.

Referring now to FIGS. 9-11 alternate embodiments of portable electronic devices are show which comprise the features of the present invention. FIGS. 9-11 show cross sectional views of three different mobile telephones 100, 200, 300 similar to that shown in FIG. 3, but having their device printed wiring boards 128, 228, 328 located at different heights 87, 88, 89 in the Z direction inside the telephone housings 112, 212, 312. Each of the telephones 100, 200, 300 comprise the same type of camera module 24 and the same type of electrical connector 34. Thus, all four telephones 10, 100, 200, 300 have the same type of camera connection system with modular components even though the telephones have their respective device printed wiring boards at different heights relative to the camera modules.

The elongated length of the contact portions 62 (see FIG. 8) of the electrical conductors allow the contacts 40 of the electrical connector 34 to make electrical connection therewith at a variety of different heights along the housing 44 of the camera module. This provides a sliding height connection or a stepless movement height connection. The same camera module 24 and electrical connector 34 can be used for portable electronic devices having their printed wiring boards at any suitable height, such as heights 86, 87, 88 and 89 inside the housings. The connection system of the present invention provides for a wide stepless range for the Z position of the camera module relative to the device printed wiring board. As seen with the embodiment shown in FIG. 11, the camera module 24 can even be located spaced from the height of the device printed wiring board. Thus, the printed wiring board does not need to include a slot for the camera module.

Figures 12, 13:
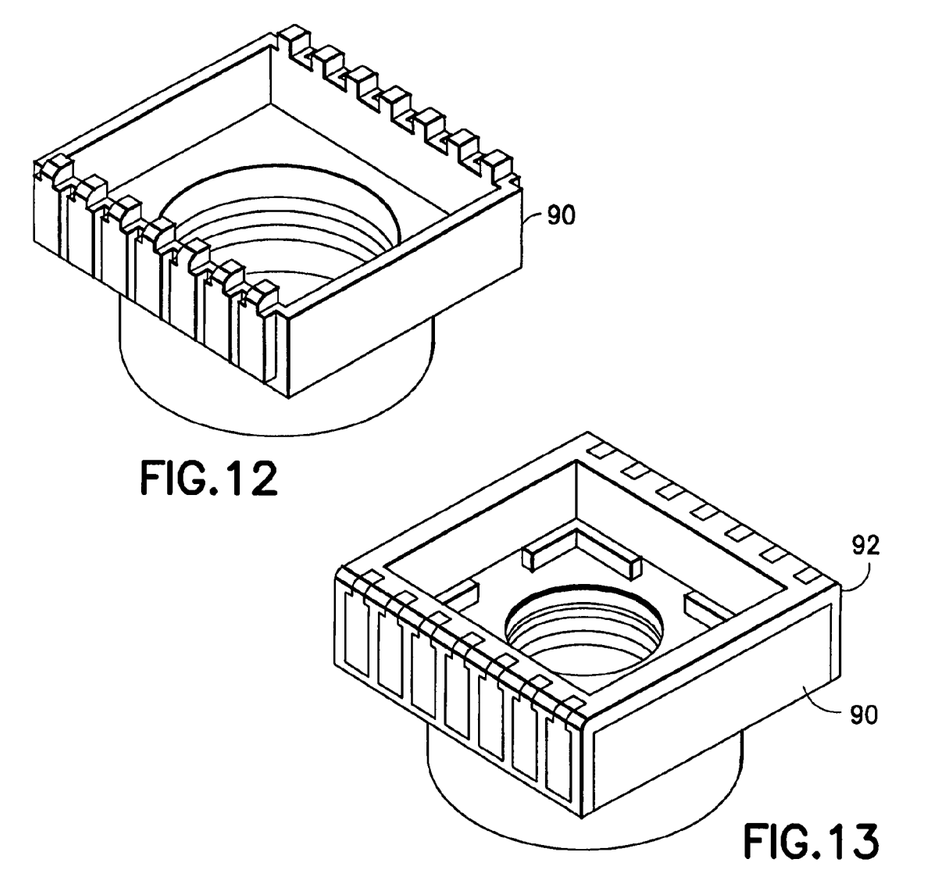
FIGS. 12-14 are perspective views showing one type of method for manufacturing the camera module housing shown in FIG. 8.
Figure 14:
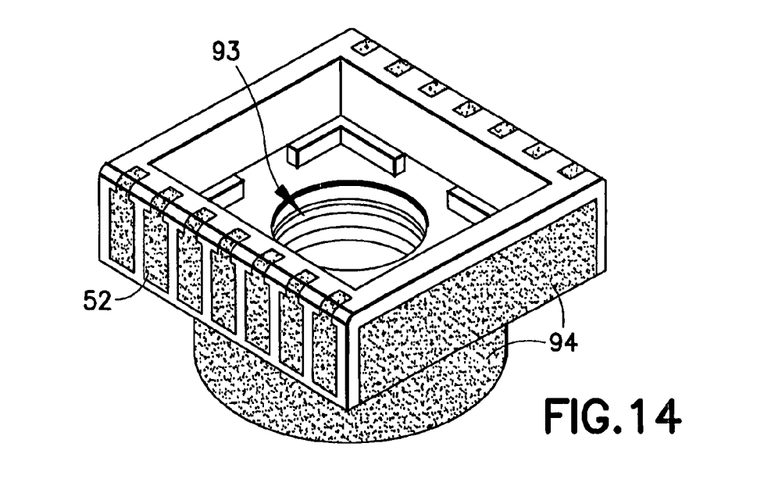

Referring now also to FIGS. 12-14 one method of manufacturing the housing 44 for the camera module 24 will be described. A member 90 can be provided which is comprised of a metallizeable plastic material. A second member 92 can be attached to the first member 90. The second member 92 can comprise a non-metallizeable plastic material. In one type of method, the second member 92 can be overmolded onto the first member 90. The members 90, 92 can be provided as a one piece member. Surfaces 93 can be masked if they are not desired to be metallized. Metallization can occur for creating the electrical conductors 52. Surfaces 94 can also be metallized for creating electromagnetic compatibility and electrical static discharge shielding. This is only an example of how this type of housing can be manufactured. There are also other ways to get equivalent constructions, such as using separately manufactured metallic contact pads installed into the plastic housing pieces. However, with the method described above, the camera housing 44 including the conductors can be provided as a one piece member.

Figure 15:
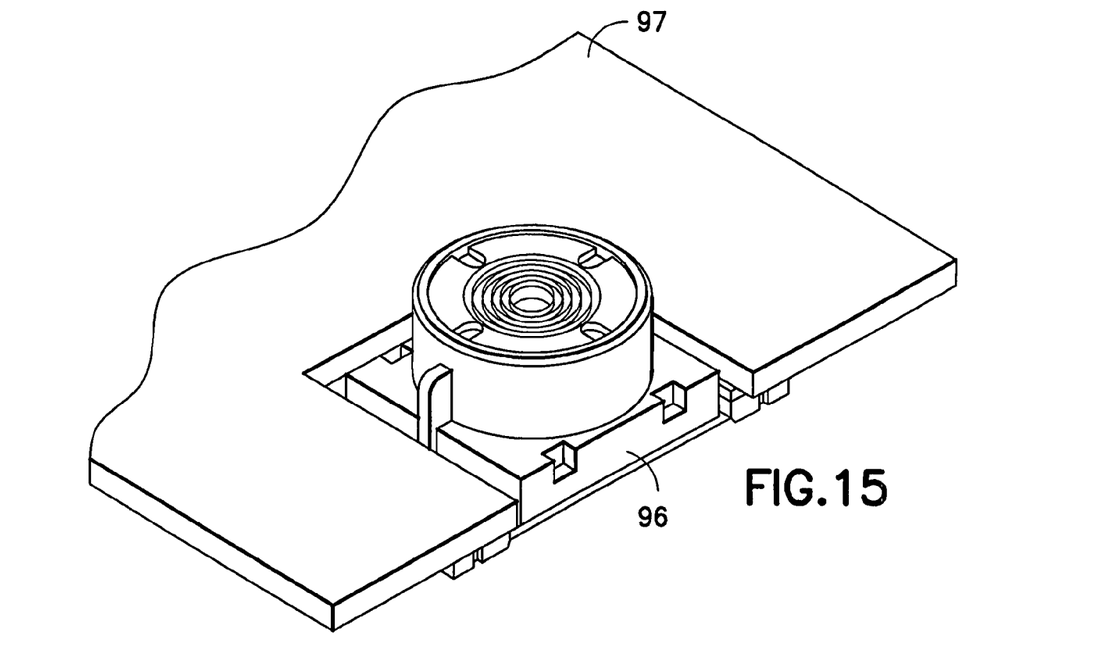
FIGS. 15-16 are perspective views of a connection of a camera module to a device printed wiring board in a mobile telephone.
Figure 16:
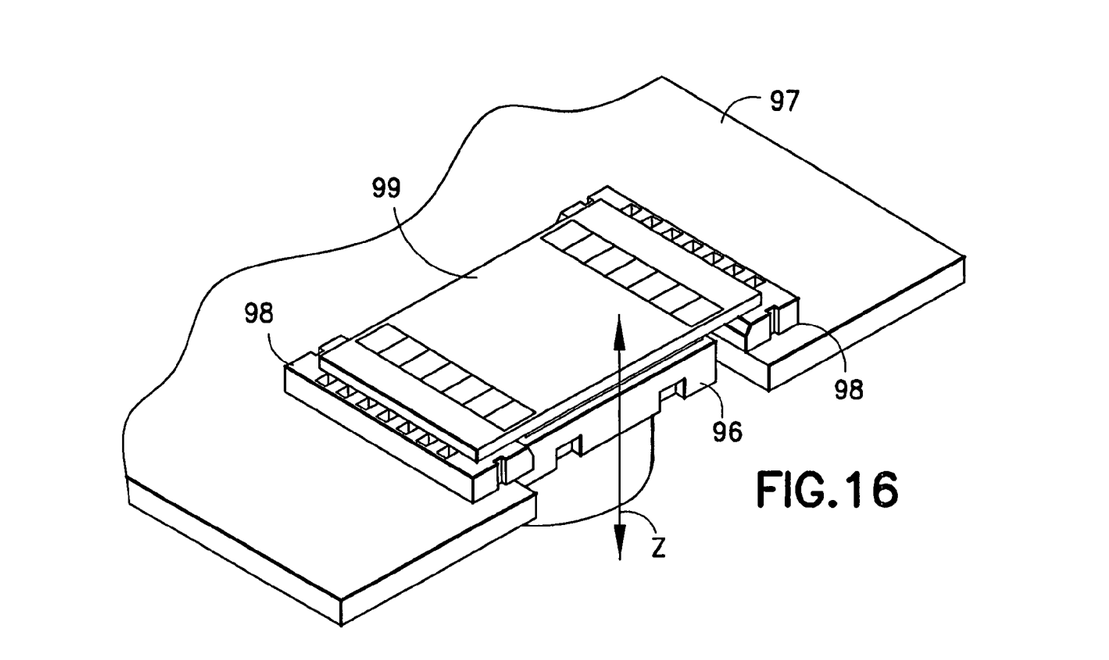

Referring to FIGS. 15-16 a connection of a camera module 96 to a device printed wiring board 97 in a mobile telephone is shown. The camera module 96 is stationarily attached to the device printed wiring board 97 by electrical connectors 98. The camera printed wiring board 99 rests on top of top surfaces of the electrical connectors 98. The height of the connectors 98 defines the camera position in the Z direction. Since the height of the connectors 98 is fixed, the position of the camera in the Z direction is limited to a single fixed position. However, the height of the assembly can be smaller than the conventional design described below with regard to FIGS. 17-18.

Figure 17:
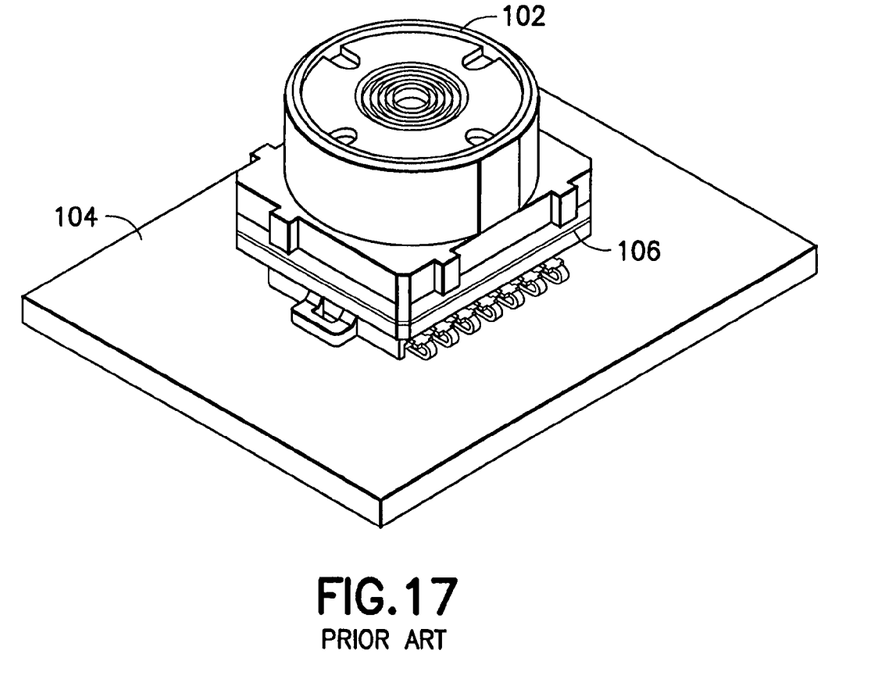
FIGS. 17-18 are perspective views of a connection of a camera module to a device printed wiring board in a conventional mobile telephone.
Figure 18:
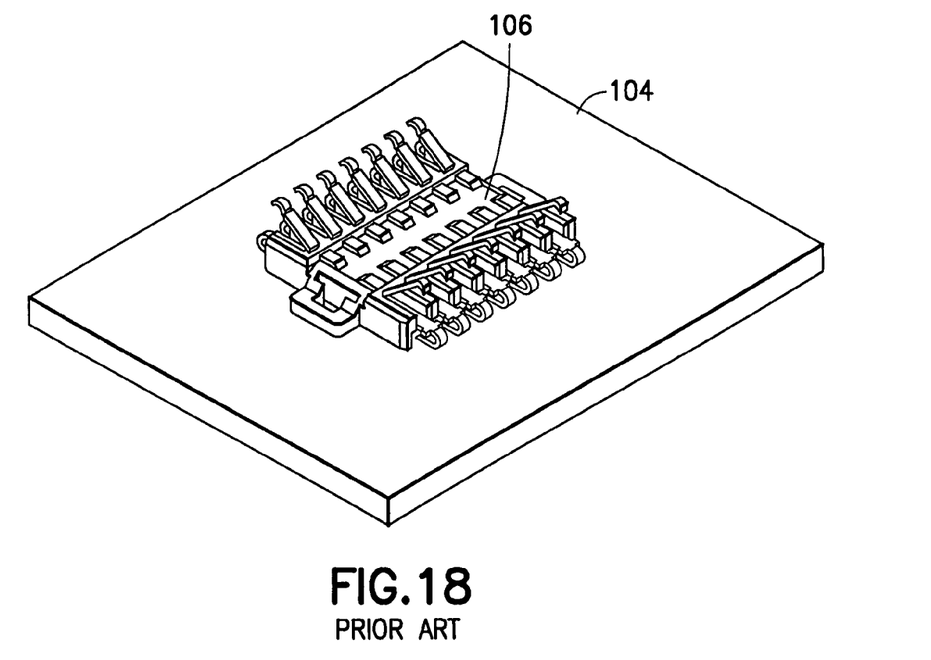

Referring also to FIGS. 17-18, a connection of a camera module 102 to a device printed wiring board 104 in one type of conventional mobile telephone is shown. In this design the electrical connector 106 is surface mounted on top of the device printed wiring board 104. The camera module 102 is mounted on top of the electrical connector 106. Similar to the design described above with reference to FIGS. 15-16, the height of the connector 106 defines the camera position in the Z direction. Since the height of the connector 106 is fixed, the position of the camera in the Z direction is limited to a single fixed position.

Unlike the connection systems described above in FIGS. 15-18, the present invention provides an electrical connection system which allows a camera module to be located at any one of a plurality of different Z direction heights relative to the electrical connector and the device printed wiring board. This allows the camera module and the electrical connector to be used as common components in different types of portable electronic devices without having to redesign the connection system if the devices have different height locations of their device printed wiring boards. The same camera module can be used in several device models. For a manufacturer, this means that less camera module variants are needed. Because less camera module variants are needed there is a result in savings in research and development as well as logistics for manufacturing and assembling camera modules.

Because a single type of module can be used in several device models, a higher volume of camera modules can be produced or purchased from a supplier. The higher volume can allow for less expensive cost per unit of camera module and electrical connector. As illustrated in comparing FIG. 11 to FIGS. 3 and 9-10, the same camera module 24 can be used on the through board constructions (FIGS. 3 and 9-10 for example) as well as on board constructions (FIG. 11 for example). With the present invention, contacts can be made on sides of the camera module so that the camera module can be contacted even if the camera's Z position is different in different devices. A connection system can be provided with a Free-Z camera position adaptability. By using different size spacers in the camera housing, the Z position can be varied and electrical contact can still be made on the sides of the camera module. The present invention provides a camera construction which makes it possible to place the camera almost freely in a Z-direction measured from the device printed wiring board.

Figure 19:
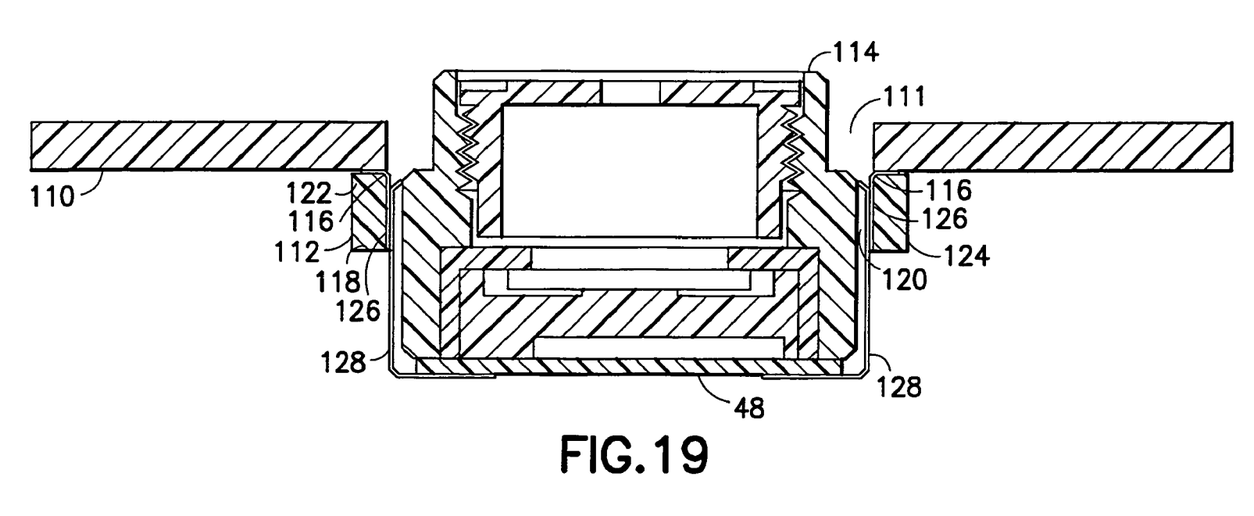
FIG. 19 is a cross sectional view of another alternate embodiment of the present invention.

Referring now to FIG. 19, a cross sectional view of an alternate embodiment of the present invention is shown. In this embodiment the electronic device comprises a printed wiring board 110, a camera electrical connector 112, and a camera 114. The printed wiring board 110 has a camera receiving slot 111. The electrical connector 112 comprises a housing 118 and electrical contacts 116. The housing 118 preferably has a general ring shape with a camera receiving area 120 in the center of the general ring shape. In an alternate embodiment, the housing could have a general C shape. Two sections 122, 124 of the housing 118 are located on opposite sides of the camera receiving slot 111. In an alternate embodiment, the housing could be comprised of two separate housing members forming the two sections 122, 124, respectively.

The electrical connector 112 is stationarily attached to one side of the printed wiring board 110, such as by surface solder mounting of its contacts 116, for example. The contacts 116 could be members attached to the housing 118 or could be metallized conductors. The contacts 116 have sections 126 which face inward towards each other from the two opposing housing sections 122, 124. The sections 126 are preferably stationary on the housing 118.

The camera 114 is substantially identical to the camera 24 except the camera 114 does not comprise metallized conductors on its housing. Instead, the camera 114 comprises electrical spring contacts 128 which extend off of the camera printed circuit board 48 in a general cantilevered fashion. More specifically, the spring contacts 128 have a first end attached to the camera printed circuit board 48, and which are bent to extend forward. When the camera 114 is inserted into the electrical connector 112 and through the camera receiving slot 111, the outward facing sides of the spring contacts 128 contact the inward facing sides of the electrical contacts 116 at sections 126. The spring contacts 128 have a length which extends a majority of the height of the camera. The camera 114 is slidably mounted in the connector 112. Thus, the spring contacts 128 can slide along the connector contacts 116 during assembly of the electronic device with the stepless movement variable height connection accommodating for any desired relative height positioning of the camera relative to the device printed wiring board. This embodiment illustrates that various different contacts would be used with the present invention.

Figure 20:
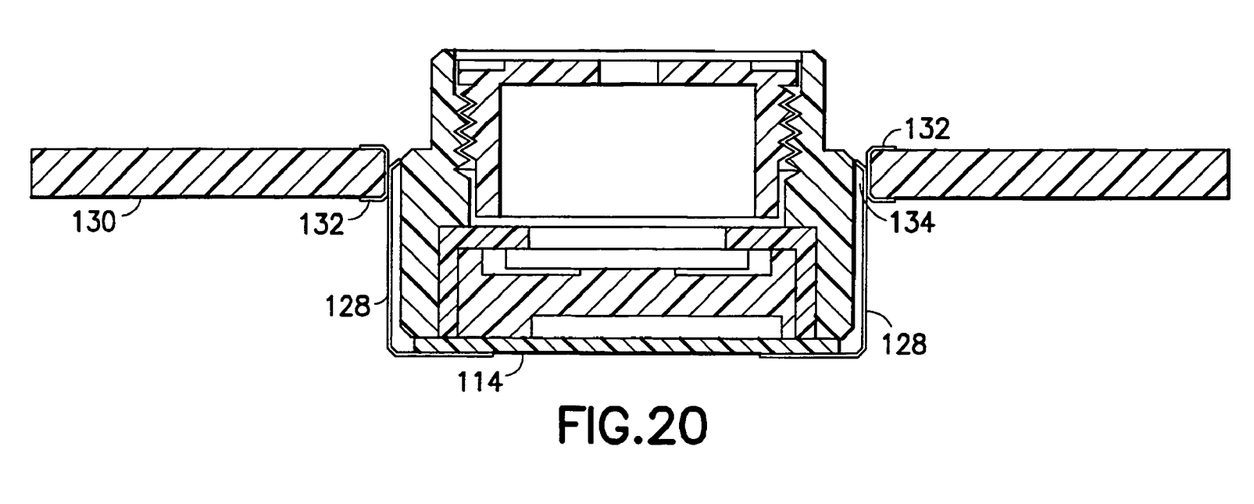
FIG. 20 is a cross sectional view of another alternate embodiment of the present invention.

Referring now to FIG. 20, a cross sectional view of another alternate embodiment of the present invention is shown. In this embodiment the electronic device comprises a printed wiring board 130 and the camera 114. The camera 114 is the same as the camera described in reference to FIG. 19. In this embodiment, the electronic device does not comprise a camera electrical connector. Instead, the device printed wiring board 130 comprises electrical contacts 132 mounted at the camera receiving slot 134. The contacts 132 are stationary on the printed wiring board, such as stationary contact pads. When the camera 114 is inserted into the camera receiving slot 134, the outward facing sides of the spring contacts 128 contact the inward facing sides of the electrical contacts 132. The spring contacts 128 have a length which extends a majority of the height of the camera. The camera 114 is slidably mounted in the slot 134. Thus, the spring contacts 128 can slide along the contacts 132 during assembly of the electronic device with the stepless movement variable height connection accommodating for any desired relative height positioning of the camera relative to the device printed wiring board. This embodiment illustrates that features of the present invention can be accommodated into a connection without a separate electrical connector.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. An apparatus comprising:
 a device printed wiring board;
 an electrical connector connected to the device printed wiring board;
 a camera coupled to the device printed wiring board by the electrical connector at a stepless movement height connection,
 wherein the stepless movement height connection allows the camera to slide relative to the electrical connector along a first axis to allow positioning of the camera relative to the electrical connector at one of a plurality of different heights along the first axis, wherein the stepless movement height connection extends beyond a height of the electrical connector along the first axis, wherein the plurality of different heights extends along a majority of a height of the camera, and wherein the majority of the height of the camera is greater than a height of the electrical connector.

2. An apparatus as in claim 1 wherein the apparatus comprises a hand-held portable electronic device.

3. An apparatus as in claim 1 wherein the electronic device comprises a mobile telephone.

4. An apparatus as in claim 1 wherein the electrical connector comprises a camera receiving slot with electrical contacts extending into the camera receiving slot, and wherein the camera is located in the camera receiving slot.

5. An apparatus as in claim 1 wherein the device printed wiring board comprises a slot, and wherein the camera extends through the slot.

6. An apparatus as in claim 5 wherein the camera comprises spring contacts and the electrical connector comprises substantially stationary conductors, and wherein the spring contacts are adapted to slide along the substantially stationary conductors when the camera is inserted into the electrical connector and into the slot of the device printed wiring board.

7. An apparatus as in claim 1 wherein the camera comprises a housing and electrical conductors on the housing, wherein the electrical conductors extend along a first lateral exterior side of the housing.

8. An apparatus as in claim 7 wherein the electrical conductors extend along an opposite second lateral exterior side of the housing, and wherein the electrical connector comprises contacts located in a camera receiving slot of the electrical connector and electrically contacting the electrical conductors on the first and second lateral sides of the housing of the camera.

9. An apparatus as in claim 7 wherein the electrical conductors extend along an adjacent side of the housing, wherein the camera comprises a camera printed wiring hoard attached to the electrical conductors on the adjacent side of the housing.

10. An apparatus as in claim 1 wherein the electrical connector comprises a housing having a general ring shape with a center camera receiving slot, and electrical spring contacts extending into the camera receiving slot from opposite sides of the general ring shape.

11. An apparatus as in claim 1 wherein the camera extends through the electrical connector in a general substantially stationary telescoping arrangement.

12. An apparatus comprising:
a housing;
camera optics and electronics inside the housing;
electrical conductors extending along a rear end of the housing and along a first lateral side of the housing; and
a camera printed wiring board stationarily connected to the rear end of the housing and coupled to the electrical conductors,
wherein the electrical conductors are adapted to be removably connected to contacts of an electrical connector located along the first lateral side of the housing, and wherein a height of the electrical conductors along the first lateral side of the housing is sized and shaped to be greater than a height of the electrical connector when the apparatus is connected to the electrical connector.

13. An apparatus as in claim 12 wherein the electrical conductors extend along a second opposite lateral side of the housing.

14. An apparatus as in claim 13 wherein the electrical conductors comprises metallized conductor paths along exterior sides of the housing.

15. An apparatus as in claim 12 wherein the electrical conductors extend along an adjacent side of the first lateral side, and wherein the camera printed wiring board is electrically connected to the electrical conductors on the adjacent side.

16. An apparatus as in claim 12 wherein the electrical conductors along the first lateral side are adapted to slide along the contacts of the electrical connector in a first axis of insertion of the apparatus into the electrical connector to provide an adjustable height connection of the apparatus to the electrical connector.

17. An apparatus as in claim 12 wherein an image inlet aperture is located at a front end of the housing.

18. An apparatus comprising:
a mobile telephone printed wiring board; and
an apparatus as in claim 12 coupled to the mobile telephone printed wiring board by an electrical connector.

19. An apparatus comprising:
a mobile telephone printed wiring board having a transceiver attached to the mobile telephone printed wiring board; and
a camera electrical connector attached to the mobile telephone printed wiring board,
wherein the camera electrical connector comprises a camera receiving area adapted to receive a camera therein and make electrical contact at one of a plurality of different locations along a majority of a height of the camera inside the camera receiving area, wherein a height of the camera receiving area is sized and shaped to be less than a height between the plurality of different locations along the majority of the height of the camera when the camera is received in the camera receiving area, and wherein the camera receiving area comprises a through hole extending entirely through a housing of the camera electrical connector.

20. An apparatus as in claim 19 wherein the camera electrical connector comprises spring contacts extending into the camera receiving area from a first lateral side of the camera receiving area.

21. An apparatus as in claim 20 wherein the spring contacts extend into the camera receiving area from a second opposite lateral side of the camera receiving area.

22. An apparatus as in claim 20 wherein the camera electrical connector comprises a housing with a general ring shape and wherein the camera receiving area is located inside the general ring shape.

23. An apparatus comprising:
a portable electronic device camera; and
an apparatus as in claim 19, wherein the portable electronic device camera is coupled to the mobile telephone printed wiring board by the camera electrical connector.

24. An apparatus comprising:
a device printed wiring board;
an electrical connector connected to the device printed wiring board, wherein the electrical connector has a camera receiving slot; and
a camera coupled to the printed wiring board by the electrical connector, wherein a housing of the camera is located partially inside the camera receiving area to provide a substantially stationary telescoping connection with a partially coplanar height, wherein the housing comprises a plastic material, wherein the camera comprises electrical conductors on a portion of a side of the housing, wherein the electrical conductors directly contact electrical contacts of the electrical connector, and wherein a height of the portion of the side of the housing comprising the electrical conductors is greater than a height of the electrical connector.

25. An apparatus as in claim 24 wherein the electrical connector comprises a housing with a general ring shape and wherein the camera receiving slot is located inside the general ring shape.

26. An apparatus as in claim 24 wherein the electrical connector comprises electrical spring contacts extending into a lateral side of the camera receiving slot.

27. An apparatus as in claim 26 wherein the electrical spring contacts extend into the camera receiving slot from two opposite lateral sides.

28. An apparatus as in claim 24 wherein the electrical conductors are disposed on at least one lateral side of the housing of the camera which are located inside the camera receiving slot.

29. An apparatus as in claim 28 wherein the electrical conductors comprises metallized conductors formed on exterior sides of the housing of the camera.

30. An apparatus as in claim 24 wherein the apparatus comprises means for locating the camera at a plurality of different heights relative to the device printed wiring board.

31. An apparatus as in claim 30 wherein the means for locating the camera comprises the camera extending through a slot in the device printed wiring board.

32. An apparatus as in claim 24 wherein the portable electronic device comprises a mobile telephone with a transceiver connected to the device printed wiring board.

33. A method comprising:
providing an electrical connector on a printed wiring board;
inserting a camera into a slot through the electrical connector; and
making electrical connection between the electrical connector and electrical conductors extending along a majority of a height of a first lateral side of the camera inside the slot of the electrical connector, wherein a height of the electrical conductors extending along the majority of the height of the first lateral side of the camera is greater than a height of the electrical connector.

34. A method as in claim 33 wherein the step of inserting the camera through the slot of the electrical connector also comprises inserting the camera through a slot of the printed wiring board.

35. A method as in claim 33 wherein the step of making electrical connection between the electrical connector and the camera comprises the electrical conductors on the first lateral side of the camera contacting spring contacts of the electrical connector inside the slot of the electrical connector.

36. A method as in claim 33 wherein the step of making electrical connection between the electrical connector and the camera comprises sliding the electrical conductors of the camera along electrical contacts of the electrical connector along an insertion path of the camera into the slot of the electrical connector.

37. An apparatus comprising:
a device printed wiring board having a slot therethrough; and
a camera extending through the slot in the device printed wiring board and coupled to the device printed wiring board by a stepless movement variable height connection,
wherein the stepless movable height connection comprises a first portion connected to the device printed wiring board and a second portion connected to the camera, wherein a height of the second portion extends beyond a height of the first portion, wherein the stepless movement variable height connection allows the camera to slide relative to the device printed wiring board along a first axis to allow positioning of the camera relative to the device prirnted wiring board at one of a plurality of different heights along the first axis, wherein the plurality of different heights extends along a majority of a height of the camera, and wherein the majority of the height of the camera is greater than a height of the first portion.

38. An apparatus as in claim 37 wherein the device printed wiring board comprises contact pads at the slot and the camera comprises spring contacts in the slot and slidable along the contact pads.

* * * * *